US005703586A

United States Patent [19]
Tucholski

[11] Patent Number: 5,703,586
[45] Date of Patent: Dec. 30, 1997

[54] DIGITAL-TO-ANALOG CONVERTER HAVING PROGRAMMABLE TRANSFER FUNCTION ERRORS AND METHOD OF PROGRAMMING SAME

[75] Inventor: Hans Juergen Tucholski, Gouldavoher, Ireland

[73] Assignee: Analog Devices, Inc., Norwood, Mass.

[21] Appl. No.: 568,453

[22] Filed: Dec. 7, 1995

[51] Int. Cl.$^6$ .................................................. H03M 1/66
[52] U.S. Cl. .......................... 341/144; 341/145; 341/118; 341/120; 341/153
[58] Field of Search ................................. 341/144, 145, 341/118, 120, 131, 153, 154

[56] References Cited

U.S. PATENT DOCUMENTS

| | | | |
|---|---|---|---|
| 4,488,144 | 12/1984 | Wollman | 340/347 |
| 5,198,814 | 3/1993 | Ogawara | 341/118 |
| 5,446,455 | 8/1995 | Brooks | 341/145 |
| 5,499,027 | 3/1996 | Karnicolas et al. | 341/120 |

FOREIGN PATENT DOCUMENTS

| 0037365 | 4/1978 | Japan | 341/120 |
|---|---|---|---|

OTHER PUBLICATIONS

Analog Devices, Inc., "Complete 3 V GSM/DCS1800 Codec," AD7015 Product Description, 1995.
Analog Devices, Inc., "3.3 V to 5 V Quad 10-Bit DACs," AD7805/AD7805 Product Description, 1995.
Analog Devices, Inc., "3V IC Is First To Integrate All Converters, Filters, Amplifiers, Modulators for GSM, DCS1800 Or PCS1900 [AD7015]," Press Release, Feb. 15, 1995.
Analog Devices, Inc., "12-Bit, 100 MSPS D/A Converters," AD9712B/AD9713B Product Description, 1992.
Boiocchi, S. et al., "Self-Calibration in High Speed Current Steering CMOS D/A Converters," Advanced A-D and D-A Conversion Techniques and their Applications, 6-8 Jul. 1994, Conference Publication No. 393, IEE 1994, pp. 148-152.
National Semiconductor Corpporation, "DAC1054 Quad 10-Bit Voltage-Output Serial D/A Converter with Readback," Product Description, Jan. 1995.
National Semiconductor Corporation, "Monolithic Quad 10-Bit DAC Integrates System Features for Simpler, More Compact Designs," Press Release, Jun. 28, 1995.
National Semiconductor Corporation, "Quad 10-Bit Voltage-Output Serial D/A Converter with Readback," DAC1054 Product Description, Aug. 3, 1995.
Tang, A.T.K. et al., "Self-Calibration for High-Speed, High-Resolution D/A Converters," Advanced A-D and D-A Conversion Techniques and their Applications, 6-8 Jul. 1994, Conference Publication No. 393, IEE 1994, pp. 142-147.
Wouter, D. et al., "A Self-Calibration Technique for Monolithic High-Resolution D/A Converters," IEEE of Solid-State Circuits, vol. 24, No. 6, Dec. 1989, pp. 1517-1522.

Primary Examiner—Jeffrey A. Gaffin
Assistant Examiner—Jason A. Vick
Attorney, Agent, or Firm—Wolf, Greenfield & Sacks, P.C.

[57] ABSTRACT

A Digital-to-Analog (D/A) converter with programmable transfer function includes a Main Converter and at least one Sub-Converter. Errors in the Main Converter are compensated for by programming the one or more Sub-Converters with compensation values determined during a Calibration Sequence. The Calibration Sequence measures the deviations of the transfer function of the Main Converter from the ideal at predetermined bit transitions of the digital input signal and generates representative separate digital signals for the one or more Sub-Converters. By combining these separate signals with the digital input signal, the net errors of the D/A Converter transfer function are reduced.

12 Claims, 11 Drawing Sheets

NOTE; ALL "I_CONTROL" RESPECTIVELY "VDS_CONTROL" TERMINALS OF CURRENT SOURCES ARE CONNECTED TOGETHER

| Bit | Max.+/- Error For +/- 1/2 LSB DNL Error (1/M) | Effective Output Contributions | # Of Unit-Current-Sources (N) | Predicted +/- "4 Sigma" DNL Error Distribution In LSB For Main-Converter | | | Predicted +/- "4 Sigma" DNLx Error Distribution In LSB For Sub-Converter | |
|---|---|---|---|---|---|---|---|---|
| | | | | Major Carry DNLx | Total DNLx | | Major Carry DNLx | Total DNLx |
| | | | | | 4 MSB's | 6 LSB's | | |
| MSB9 | 1/1024 | 8 M-Segment | 8 x (64-A) | 16 x K | | | | |
| MSB8 | 1/512 | 4 M-Segment | 4 x (64-A) | 16 x K | | | | |
| MSB7 | 1/256 | 2 M-Segment | 2 x (64-A) | 16 x K | 16 x K | | | |
| MSB6 | 1/128 | 1 M-Segment | 1 x 64-A | 16 x K | | | | |
| LSB5 | 1/64 | 8 L-Segment | 8 x 8 | 2.828 x K | | | | |
| LSB4 | 1/32 | 4 L-Segment | 4 x 8 | 2.828 x K | | | | |
| LSB3 | 1/16 | 2 L-Segment | 2 x 8 | 2.828 x K | | 3.606 x K | | |
| LSB2 | 1/8 | 1 L-Segment | 8 | 2.828 x K | | | | |
| LSB1 | 1/4 | 1/2 L-Segment | 4 | 2 x K | | | | |
| LSB0 | 1/2 | 1/4 L-Segment | 4 | 1 x K | | | | |
| AUX.LSB0 | 1/2 | 1/4 L-Segment | 4 | 1 x K | | | | |
| SUB-MSB2 | 1/4 | 1/2 L-Segment | 4 | | | | 2 x K | |
| SUB-MSB1 | 1/2 | 1/4 L-Segment | 4 | | | | 1 x K | |
| SUB-MSB3 | 1/1 | 1/8 L-Segment | 4 | | | | 0.5 x K | |
| SUB-LSB2 | 2 | 1/16 L-Segment | 4 | | | | 0.25 x K | |
| SUB-LSB1 | 4 | 1/32 L-Segment | 4 | | | | 0.125 x K | |
| SUB-LSB0 | 8 | 1/64 L-Segment | 4 | | | | 0.0625 x K | 2.309 x K |

Note  K = 4 x Sigma (Vtp) / (Veff/2)

FIG. 7

DIGITAL-TO-ANALOG CONVERTER HAVING PROGRAMMABLE TRANSFER FUNCTION ERRORS AND METHOD OF PROGRAMMING SAME

FIELD OF THE INVENTION

The invention is generally in the area of Digital-to-Analog (D/A) Converters. More specifically, the invention relates to programmable apparatus for reducing errors in D/A Converters.

BACKGROUND OF THE INVENTION

D/A Converter transfer function performance is generally characterized by resolution, relative accuracy and a number of additional performance parameters, such as settling time in the time domain, and distortion or signal-to-noise ratio in the frequency domain. As resolution and relative accuracy fundamentally limit the usefulness of any D/A Converter, different architectures based on voltage- or current-mode principles have been used to increase resolution and achieve appropriate relative accuracy. In many applications of D/A Converters, such as inside control loops, monotonicity of the transfer function is an important characteristic relating to stable loop behavior.

Many fabrication processes for linear integrated circuits and integrated circuits including linear portions include production of precision components such as thin-film resistors which can be trimmed after wafer processing to reduce transfer function errors. Converters fabricated using less complex processes can also be corrected. Fusible links accessible through external connections may be used to trim circuits, but less accurately than using thin-film resistors. Error reduction by "blowing out" selected links is performed after assembly into the IC package.

Other conventional D/A Converters employ active transfer function error reduction techniques which can continuously be applied to the converter under operating conditions. However, the error reduction achieved is limited by the precision and stability of the components used for correction. Furthermore, the required algorithms tend to be complex and may involve arithmetic and logical operations. Some methods may also require continuous clock-signals which tend to produce feedthrough components in the D/A Converter outputs.

Increasing need for D/A Converters embedded in CMOS VLSI integrated circuits has narrowed the choice of components available to implement the converter, including error correcting circuits, to those available on CMOS processes. Unfortunately, most CMOS processes are optimized for implementing digital functions. However, it is desireable that the overall yield with respect to performance specifications of any integrated circuit not be dominated by peripheral functions such as embedded D/A Converters. This yield consideration may limit the specified relative accuracy to less than implied by the resolution. For example, a D/A Converter with 10 bits resolution, that is 1024 quantization levels in response to the digital signal, implies a differential linearity error (DNL error) of less than $1/1024$ or 1 least significant bit, LSB. If this is exceeded, the resolution accuracy is reduced appropriately. For many applications, typical resolution requirements for D/A Converters are 10 bits or more, however, in practice relative accuracy of 1 or 2 bits less than implied by resolution is achieved over the full distribution spectra of those process and component variables that contribute to accuracy errors. This is particularly the case for low cost CMOS processes.

SUMMARY OF THE INVENTION

Thus, it is a general aim of the present invention to provide D/A Converters having high relative accuracy performance, exceeding the performance implied by resolution, for example, for differential linearity. Such high accuracy performance may, according to the invention be achieved by combining improved and uncomplicated methods for error reduction with suitable architectures in accordance with aspects of this invention. D/A Converters constructed according to some aspects of this invention, particularly current-mode converters for low supply-voltage and power dissipation, constructed on low cost CMOS processes, are capable of achieving a substantial improvement in relative accuracy as compared to the performance of known D/A Converters. Significantly, a D/A Converter embodying invention is efficiently realizable in monolithic form.

The invention relates to a Digital-to-Analog Converter whose transfer function errors are programmable. Such a converter includes a Main-Converter responding to the digital input signal to be converted into an analog output, having a predetermined number of bits with low significance contributing to transfer function errors less than implied by resolution. The Digital-to-Analog Converter includes at least one Sub-Converter responding to computed digital signals representing corrections of deviations of the transfer function of the Main-Converter from the ideal transfer function and further including Resistive Means connected between outputs of the Main-Converter and outputs of any Sub-Converter.

Each Sub-Converter transfer function is a predetermined portion of the Main-Converter transfer function, but having a predetermined and greater, i.e. finer resolution than the Main-Converter resolution. The Sub-Converter transfer functions also have smaller differential linearity errors than implied by the Main-Converter resolution. The output of the D/A Converter is the sum of the outputs of the Main-Converter and each Sub-Converter. Thus, differential linearity errors, caused in response to the digital input signal, are reduced by correcting these errors at the output by means of each Sub-Converter responding to separate computed digital signals.

A Calibration Sequence measures the deviations of the actual transfer function from the ideal at predetermined bit transitions of the digital input signal. The deviations found by the Calibration Sequence represent the transfer function errors at the predetermined bit transitions. These deviations are represented by separate digital control data signals. By combining these digital control data signals with the digital input signals to produce the computed digital signals for each Sub-Converter, a calibrated D/A Converter transfer function is obtained. Remaining errors are determined only by the resolution and accuracy of each Sub-Converter and the accuracy of error measurement during the Calibration Sequence.

BRIEF DESCRIPTION OF THE DRAWINGS

A more detailed understanding of the invention will be obtained by reference to the detailed description below, and to the drawings in which like reference numerals denote like structures.

3

Figure 3:
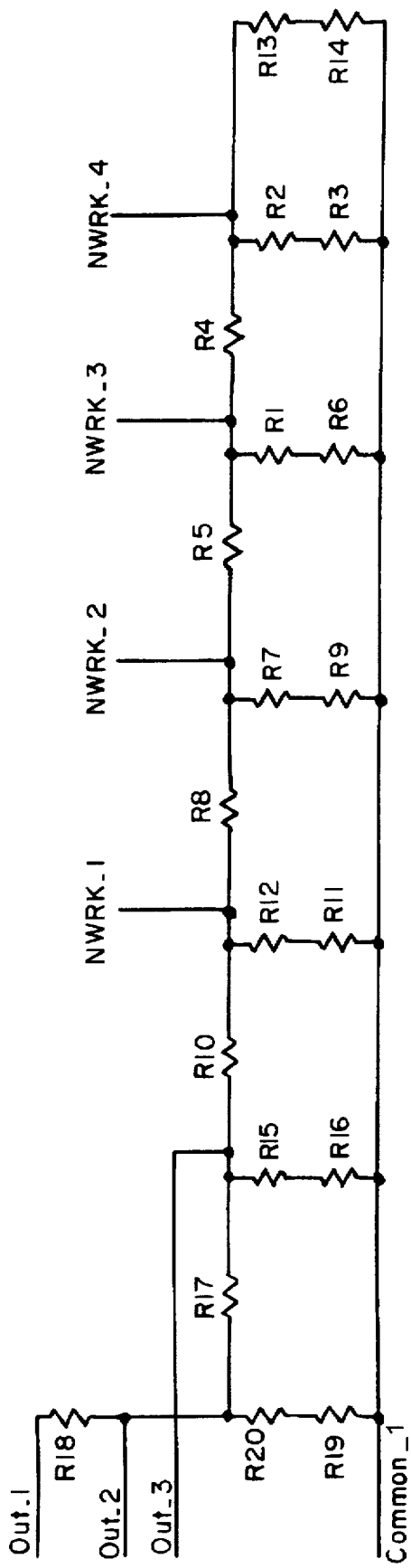
Figure 8:
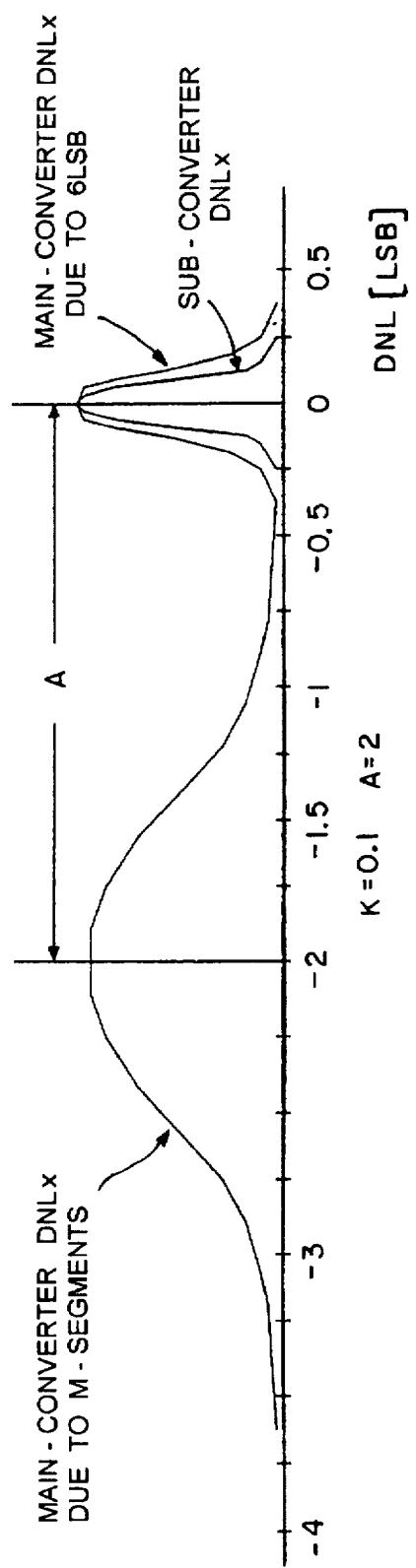
Figure 4:
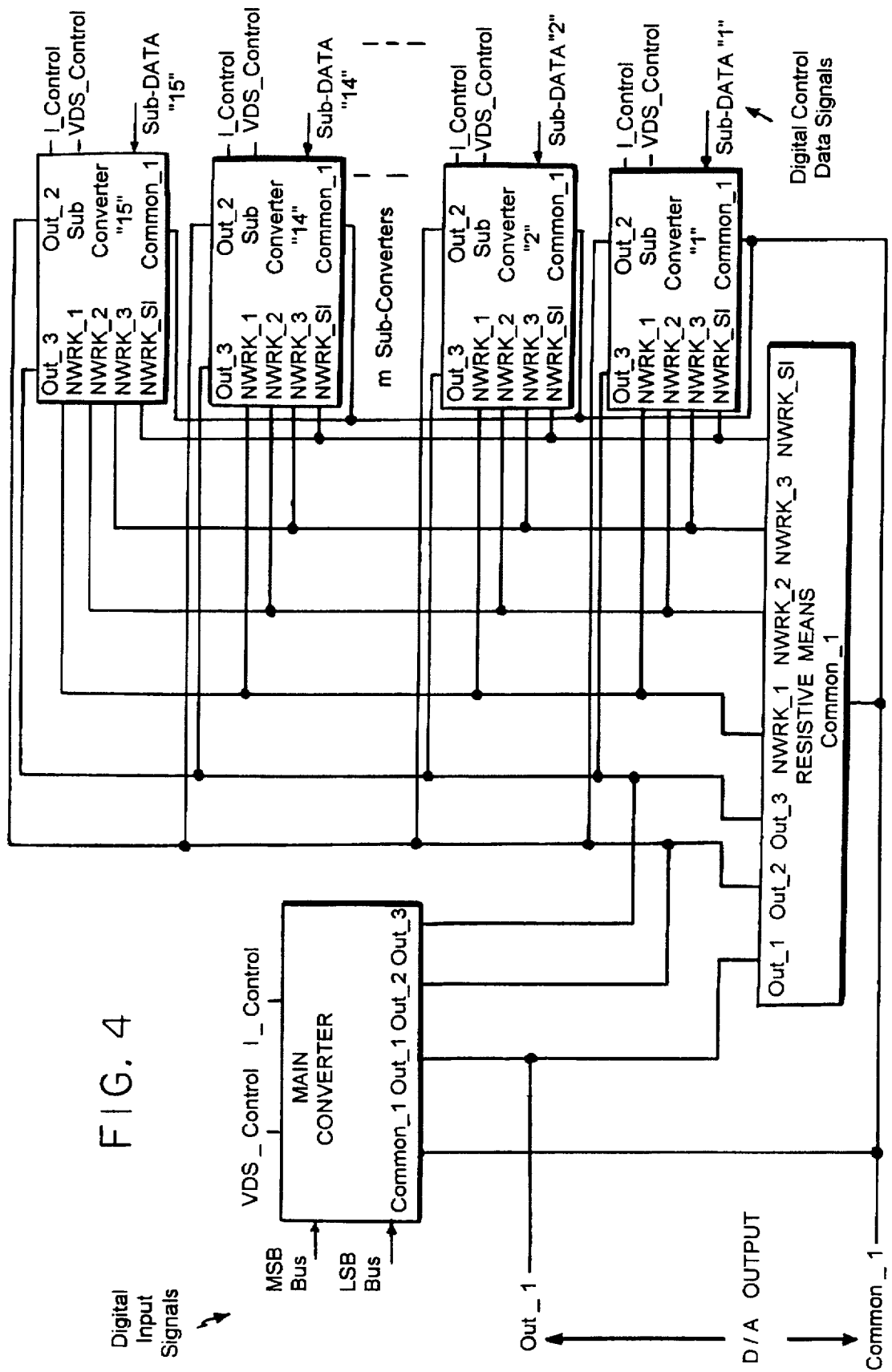
Figure 5:
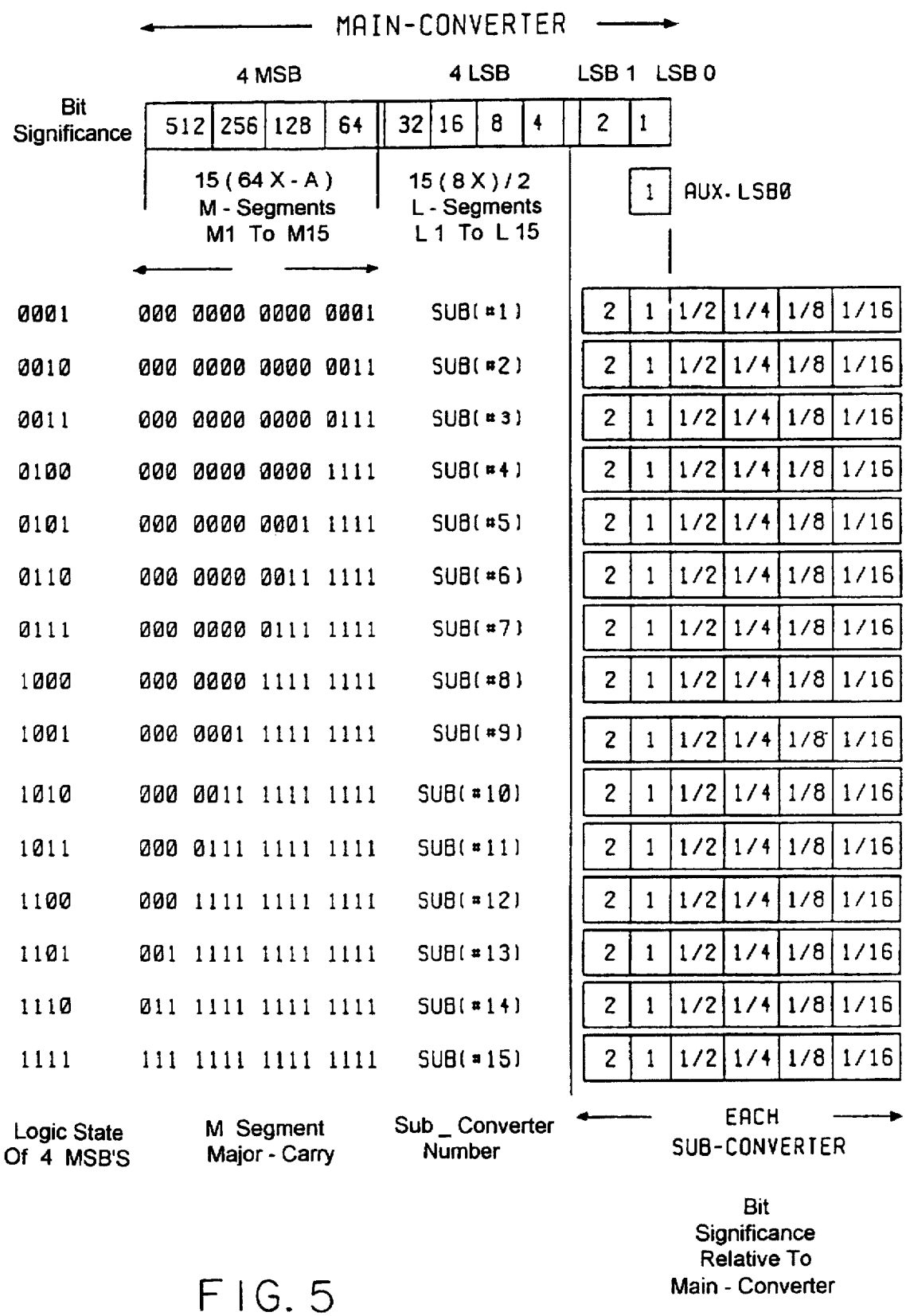
Figure 6:
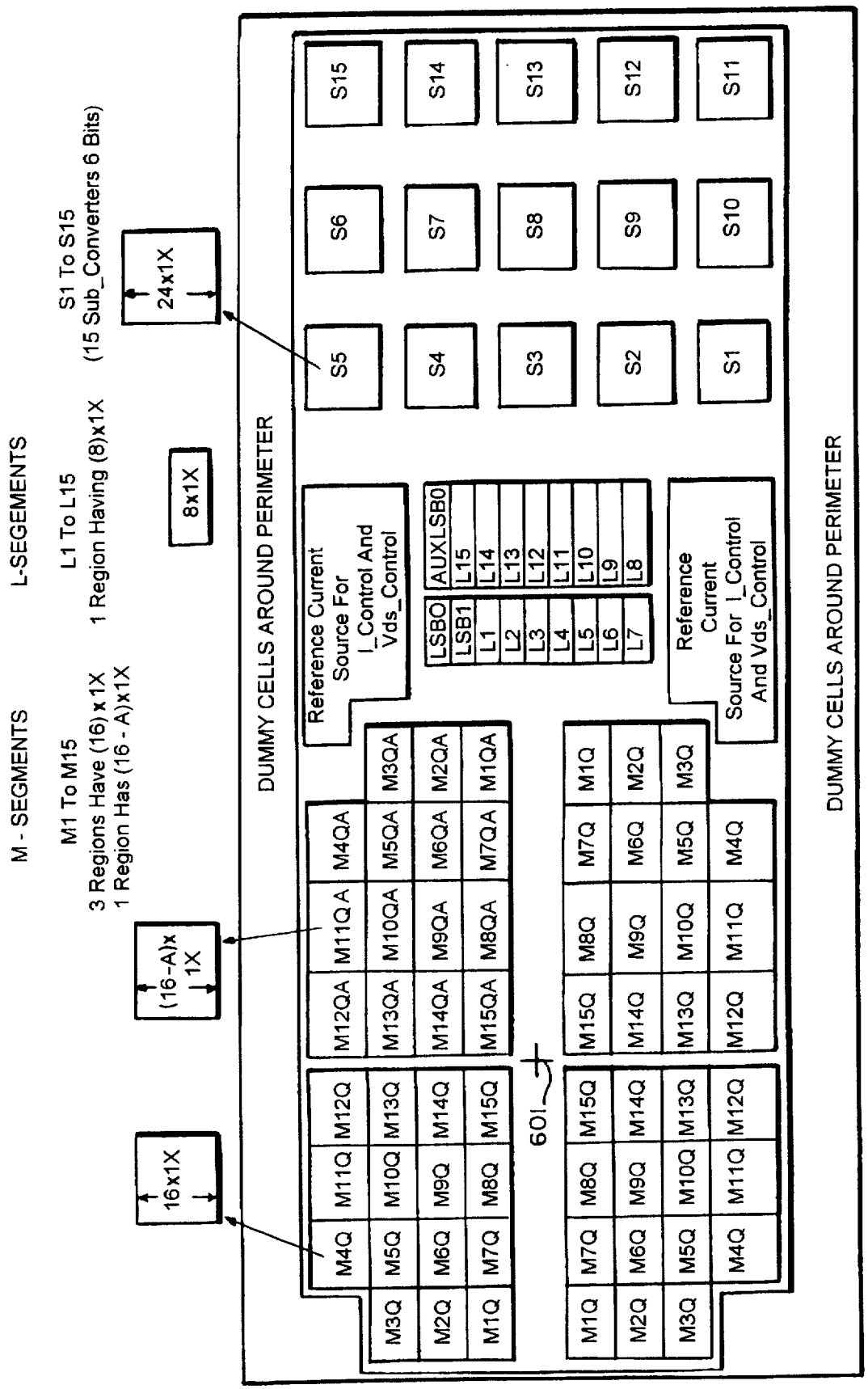
Figure 9:
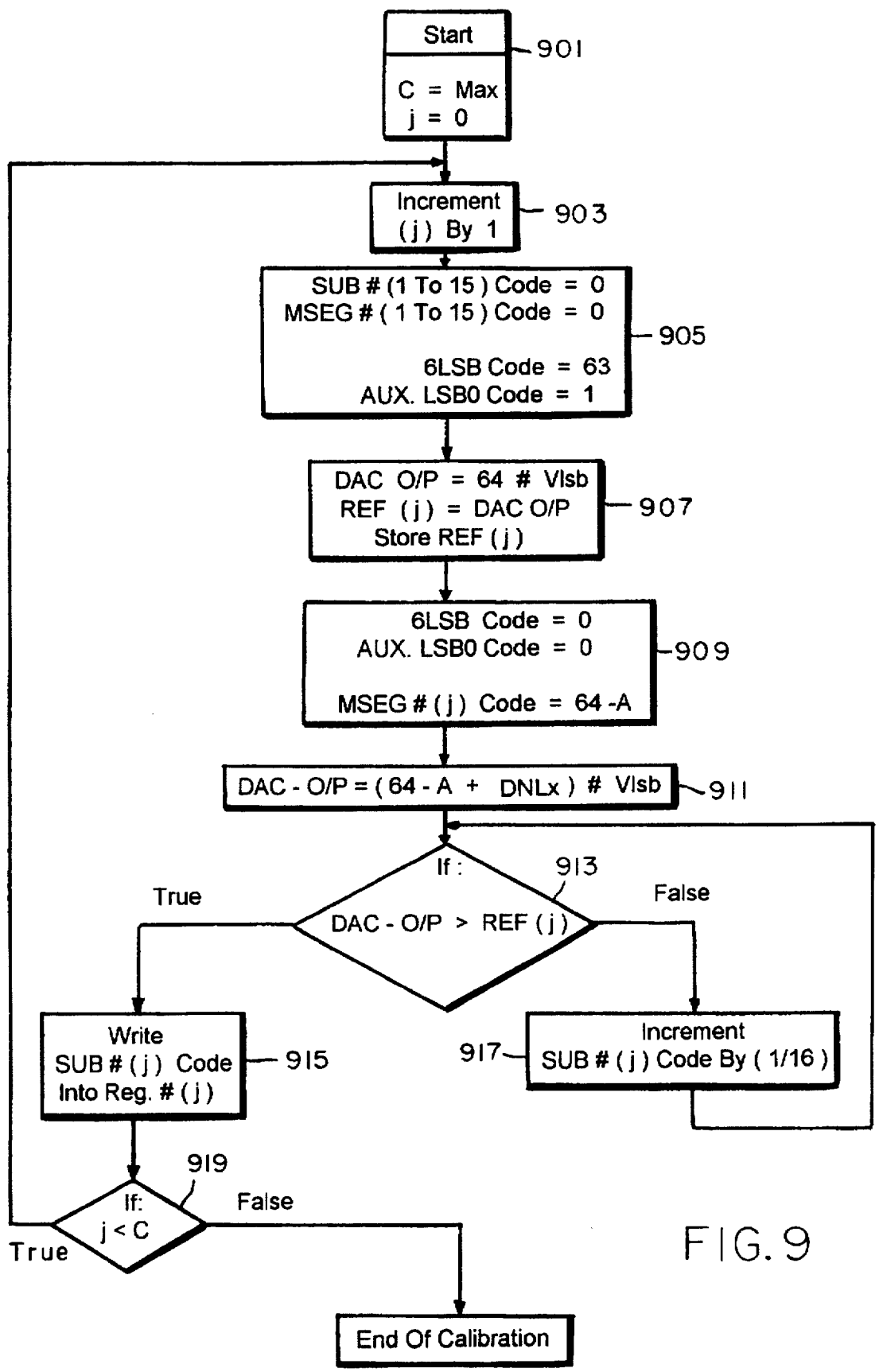
Figure 10:
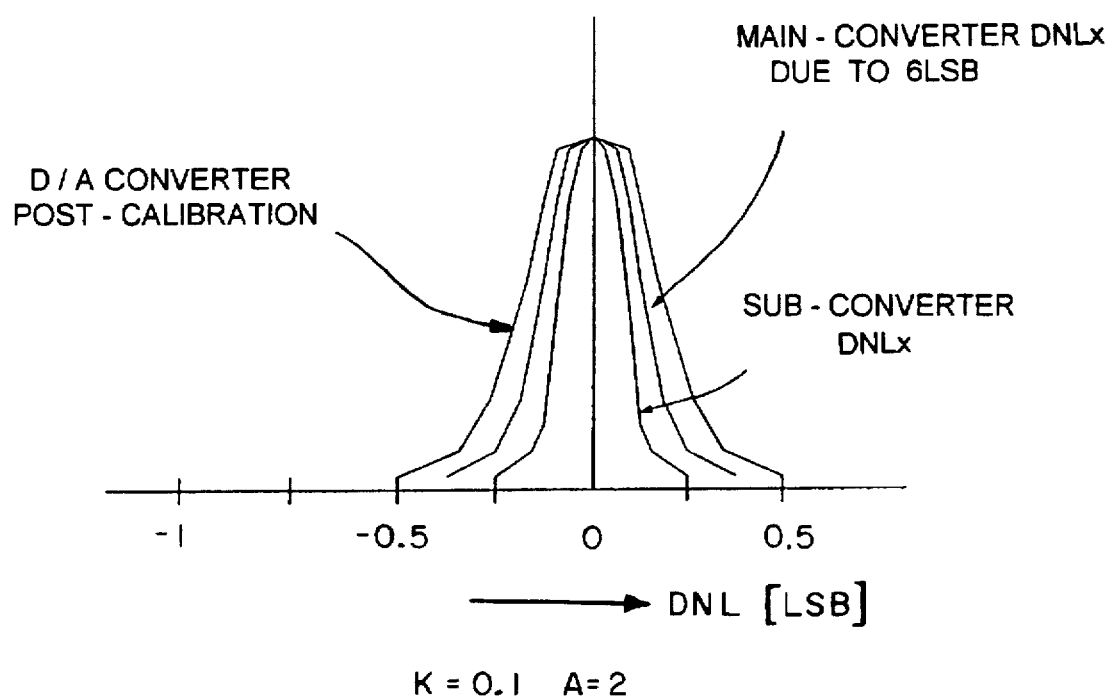
Figure 11:
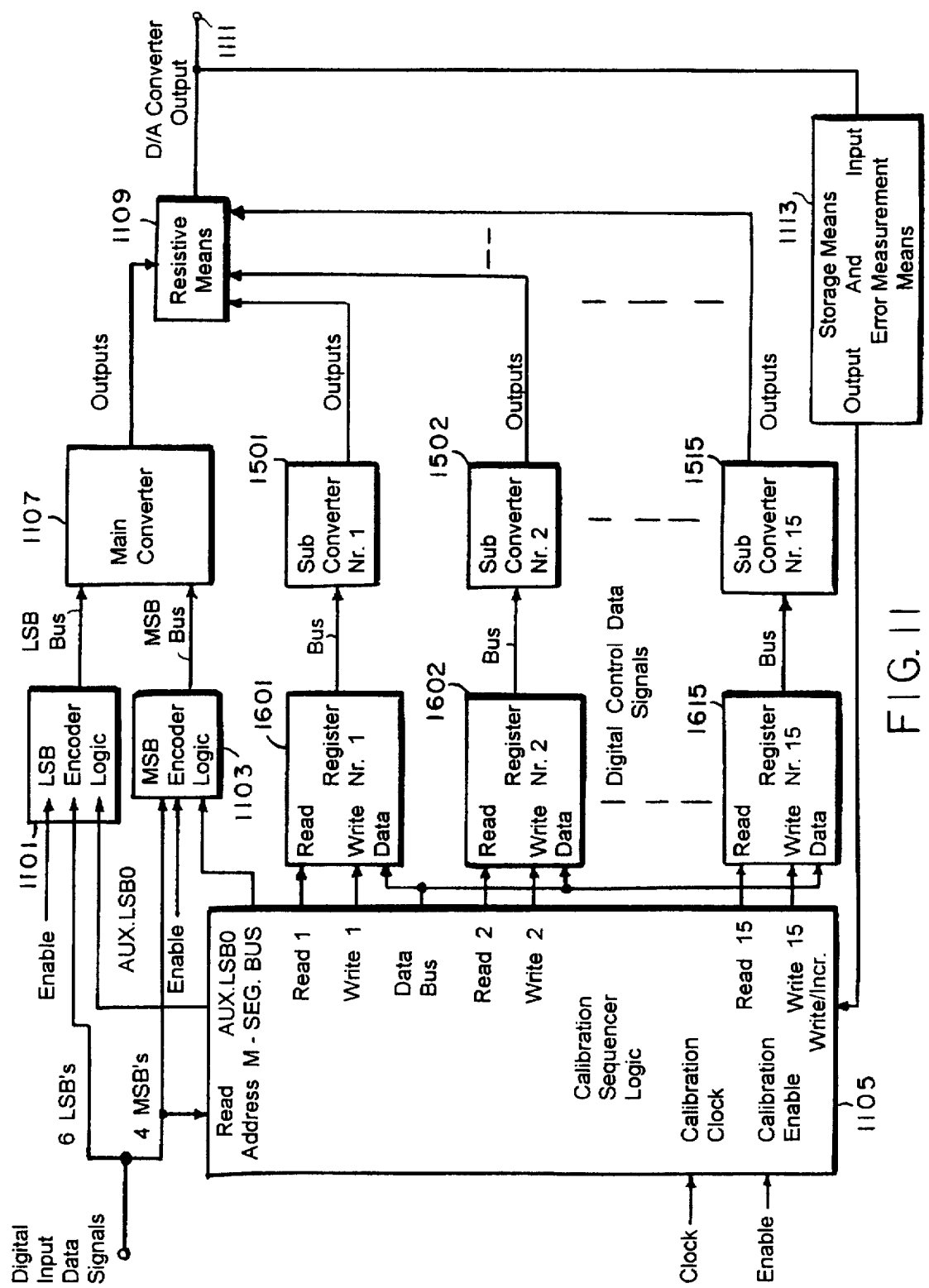

FIG. 3 is a schematic of the Resistive Means,

FIG. 4 is a block schematic of the D/A-Converter analog section according to the preferred embodiment of the invention, FIG. 5 is an illustration of the contribution of bits and the correspondence between MSB's, M-Segments and Sub-Converters, FIG. 6 is an example of the layout of the plurality of Unit Current Sources to construct the Main and Sub-Converters according to the preferred embodiments, FIG. 7 is a table of predicted pre-calibration differential linearity errors (DNL Errors) of the D/A Converter, FIG. 8 is a graphical representation of the Main and Sub-Converter pre-calibration DNL Error distribution, FIG. 9 is a graphical representation of a preferred Calibration Sequence according to this invention, FIG. 10 is a table of predicted post-calibration DNL Errors of the D/A Converter, and FIG. 11 is a simplified block schematic of the D/A Converter according to the preferred embodiment and including a Calibration Sequencer Logic block.

DETAILED DESCRIPTION

An illustrative embodiment of the invention comprises a Main-Converter, responding to digital input data signals, whose transfer function errors are programmable by a plurality of Sub-Converters responding to separate computed digital signals, called digital control data signals. A Calibration Sequence determines deviations, which represent the transfer function errors of the Main-Converter and converts these into corresponding digital control data signals for each Sub-Converter. After completion of the Calibration Sequence, these control data signals are combined with the digital input signals to form the computed digital signals provided to the Sub-Converters. The Digital-to-Analog Converter further comprises Resistive Means connected between outputs of the Main and any Sub-Converters. The Main and Sub-Converters and Resistive Means are constructed in a way that the transfer function errors are predictable and any of the Sub-Converter transfer function errors are substantially less than implied by resolution of the Main-Converter.

Figure 1:
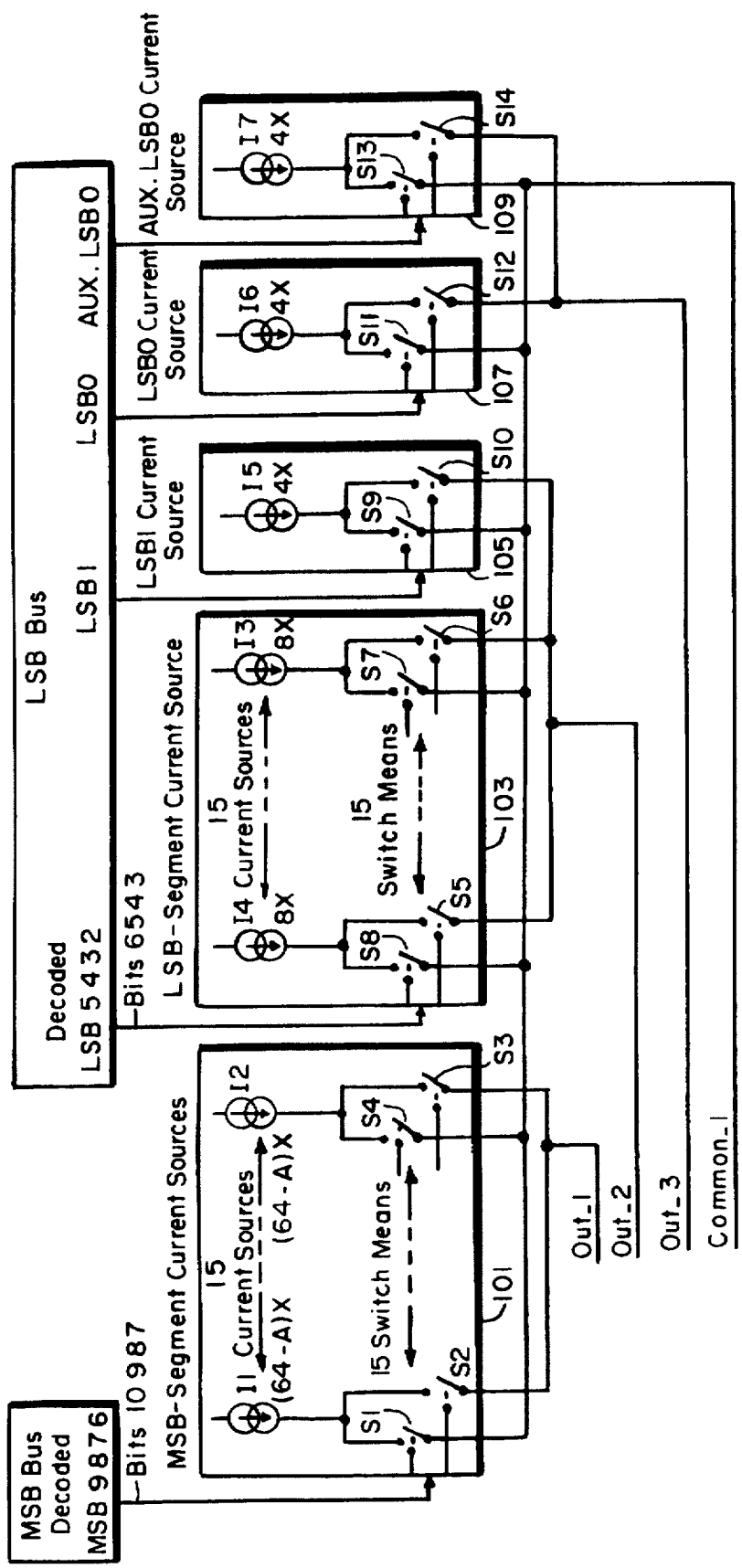
FIG. 1 is a simplified schematic of the Main-Converter embodiment.

For illustrative purposes of the invention, a 10-bit resolution D/A Converter is shown. Referring to FIG. 1, the Main-Converter is shown, consisting of a plurality of MSB-SEGMENT Current Sources 101, a plurality of LSB-SEGMENT Current Sources 103, an LSB 1-Current Source 105, an LSB0-Current Source 107, an AUXILLIARY LSB0-Current Source 109, and corresponding switch means S1–S14 responding to digital signals of an MSB BUS and an LSB BUS.

Figure 1A:
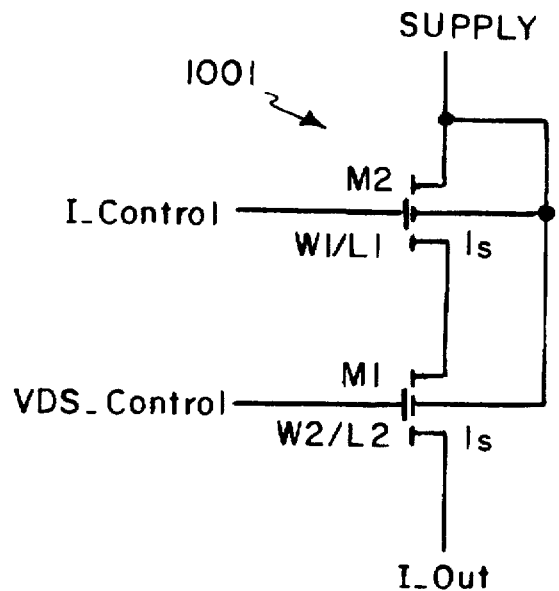
FIG. 1a is a schematic of a unit current source.

The MSB-SEGMENT Current Sources 101 include 15 current sources (I1 and I2 and 13 sources not shown), each with an equal scale factor of (64–A)X with "A" being an integer number; and 15 switch means (S1–S4 and 26 switch means not shown), each with an equal scale factor of SWM. Each (64–A)X current source shown includes an array of (64–A) Unit-Current-Sources 1001 as shown in FIG. 1a. In response to the signals from the MSB BUS, a number of current source outputs are selectively steered to OUT_1 or to COMMON_1. The number of (64–A)X sources steered to OUT_1 is equivalent to the decimal value of the 4 MSBs of the digital input signal.

The LSB-SEGMENT Current Sources 103 are similar to the MSB-SEGMENT Current Sources 101, but with a scale

4 factor of 8X and a switch means scale factor of SWL. Each 8X current source (I3 and I4 and 13 sources not shown) includes an array of 8 Unit-Current-Sources 1001 as shown in FIG. 1a. All Unit-Current-Source control inputs I_CONTROL are connected together, as are control inputs VDS_CONTROL. In response to the signals from the LSB BUS, representing the 4 LSB's with highest significance, Bit 5, 4, 3, 2, a number of current source outputs are selectively steered to OUT_2 or to COMMON_1. The number of 8X sources steered to OUT_2 is equivalent to the decimal value of these 4 LSBs of the digital input signal.

The LSB1-Current Source 105, LSB0-Current Source 107 and AUXILLIARY-LSB0-Current Source 109 are constructed with scale factors of 4X for each current source I5–I7 and of SWL/2 for each switch means S9–S14. Each 4X current source shown I5–I7 includes an array of 4 Unit-Current-Sources 1001 as shown in FIG. 1a. The LSB1-Current Source output is steered to OUT_2 or COMMON_1 in response to the next lower significant bit, LSB1. The LSB0-Current Source output is steered to OUT_3 or to COMMON_1 in response to the least significant bit, LSB0. The AUXILLIARY-LSB0-Current Source is steered to OUT_3 or to COMMON_1 in response to an AUXILLIARY bit, AUX.LSB0. The control inputs I_CONTROL of all Unit-Current-Sources used for the Main-Converter are connected together, as are control inputs VDS_CONTROL.

FIG. 1a shows the construction of a 1X scaled Unit Current Source 1001, having an output, I_OUT, comprising a current determining device M2 controlled at an I_CONTROL terminal and a cascoded source follower device M1, controlled at a VDS_CONTROL terminal. All the I_CONTROL terminals of the Unit Current Sources of an array are connected together, as are all the VDS_CONTROL terminals.

Figure 2:
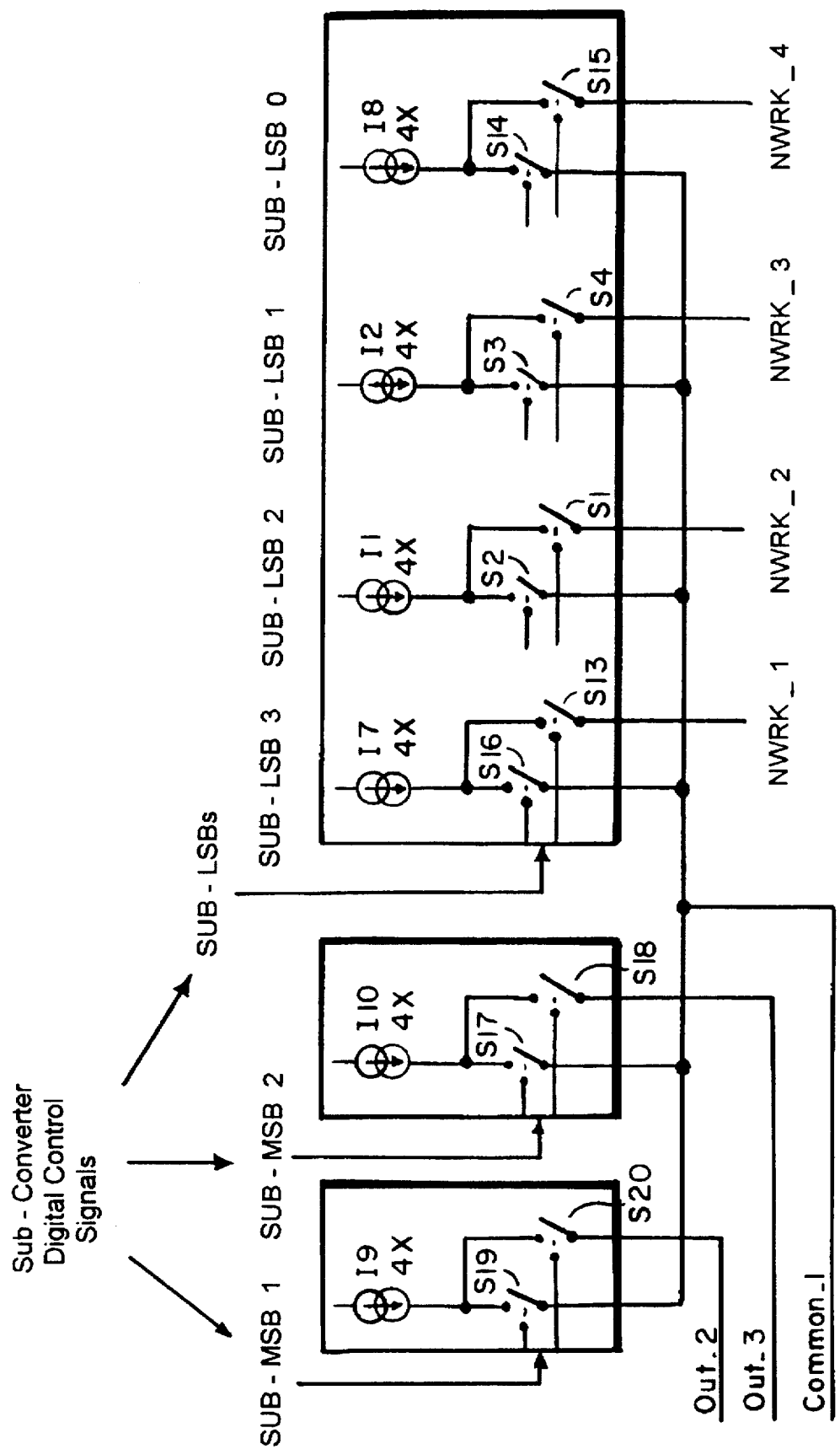
FIG. 2 is a simplified schematic of the Sub-Converter embodiment.

Turning now to FIG. 2, a Sub-Converter embodiment is described. This Sub-Converter embodiment includes 6 current sources (I1, I2 and I7–I10) and 12 corresponding switch means (S1–S4, S13–S18) responding to Sub-Converter Digital Control Signals. All 6 current sources (I1, I2 and I7–I10) are scaled with a scale factor 4X and all 12 switch means (S1–S4 and S13–S18) with a scale factor SWL/2. Each 4X Sub-Converter current source includes an array of 4 Unit-Current-Sources 1001 as shown in FIG. 1a. The first current source I9 output is steered to OUT_2 or to COMMON_1 in response to the Sub-MSB1 signal. The second current source I10 output is steered to OUT_3 or to COMMON_1 in response to the Sub-MSB2 signal. The third current source I7 output is steered to NWRK_1 or to COMMON_1 in response to the Sub-LSB3 signal; the fourth I1, fifth I2 and sixth I8 current sources are steered to NWRK_2, NWRK_3, NWRK_4, respectively, or to COMMON_1 in response to Sub-LSB2, Sub-LSB1, Sub-LSB0 signals, respectively.

A suitable Resistive Means is shown in FIG. 3. It comprises a network of resistive elements R1–R17 and R19–R20 of a resistance R, forming a R-2R ladder network between COMMON_1 and OUT_2 terminals. A further resistive element R18 of resistance R is connected between OUT_1 and OUT_2. Further terminals, OUT_3, NWRK_1, NWRK_2, NWRK_3, NWRK_4 are connected as shown at junctions of the network. The R-2R Network is terminated at terminal NWRK_4, such that the resistance of the network between terminals OUT_2 and COMMON_1 is nominally equal to the value of the resistive elements R of the R-2R ladder network.

The architecture of the analog section of the D/A Converter according to this embodiment of the invention is depicted in FIG. 4. For clarity of the figure, only four of a total of 15 Sub-Converters are shown. The terminals OUT_2, OUT_3 and COMMON_1 of the Main-Converter, the Resistive Means and all 15 Sub-Converters are connected together. The OUT_1 terminal of the Main-Converter is connected to the OUT_1 terminal of the Resistive Means. Further, the terminals NWRK_1, NWRK_2, NWRK_3 and NWRK_4 of all 15 Sub-Converters are connected to the corresponding terminals of the Resistive Means. The Unit-Current-Source control input terminals, I_CONTROL and VDS_CONTROL, of the Main-Converter and Sub-Converters are connected together. For clarity, FIG. 4 does not show circuitry for output current and drain-to-source voltage control of cascoded current sources according to the Unit-Current-Source as shown in FIG. 1a, as it is well-known in the art. The Digital Input Data Signals, represented by the MSB BUS and the LSB BUS, are connected to the Main-Converter, causing the selection of current source outputs as described above. The LSB BUS also contains a digital signal steering the output current of the AUX.LSB0 current sources. Similarly, the Digital Control Data Signals, represented by Sub-Data"1" to Sub-Data"15", are connected to respective Sub-Converters, causing the selection of current source outputs as described above. Responsive to the digital signals, an analog output voltage is developed between terminals OUT_1 and COMMON_1.

FIG. 5 shows the Main and Sub-Converter bit weights in LSB of the 10 bit D/A Converter of the illustrative embodiment and the correspondence of the 15 Sub-Converters, Sub(#j), with the Main-Converter's 4 MSB codes. Listed are the pattern of M-Segment Major-Carry transitions with respect to the logic states of the 4 MSBs of the Digital Input Data Signals. The M-Segments are identified as M1 to M15. It is understood, that when all 4 MSBs are logic 0s, none of the M-Segments contribute to the analog output and when all 4 MSBs are logic 1s, all 15 M-Segments contribute. The remaining possible states are listed as shown. The 4 (most significant) LSBs control the L-Segments in the same manner. The remaining bits, LSB1, LSB0 and AUX.LSB0 are not segmented.

A Layout of the analog section of a monolithic D/A Converter according to this aspect of the invention is depicted in FIG. 6.

The 15 M-Segments are layed out as four regions, symmetrically disposed about a central point 601, each including 15 blocks of 16 Unit-Current-Sources numbered M1Q to M15Q connected in parallel. As described above, and shown in FIG. 1, each M-Segment consists of (64-A) Unit-Current-Sources. Therefore, a total number of (A) Unit-Current-Sources are rendered inactive. This is shown in FIG. 6 as M1QA to M15QA, each having (16-A) Unit-Current-sources only. Adjacent to the complete Array of M-Segments, the Unit-Current-Sources forming the AUXLSB0, LSB0, LSB1 and L-Segments are located as shown. The L-Segments are composed of an arrangement of 15 current sources, numbered L1 to L15, each consisting of 8 Unit-Current-Sources and arranged in such a way, that electrical deviations due to processing or other influences are minimized. One way of minimizing processing variations is shown in FIG. 6 where adjacent L-Segments correspond to adjacent code transitions of the 4 LSBs. The 15 Sub-Converters, Sub(#1) to Sub(#15), each consisting of 6 current sources composed from 4 Unit-Current-Sources, are located adjacent to the LSB and L-Segment array. The Sub-Converters are also arranged in such a way, that electrical deviations due to processing or other influences are minimized. Layout spaces around the arrangement of the array are provided for the Reference Current Sources which serve to provide potentials for all Unit-Current-Source control inputs. The perimeter of the array contains so-called Dummy Cells consisting of suitable numbers of Unit-Current-Sources not electrically connected with the above-described arrays. The outputs of the M-Segments, L-Segments, LSB1, LSB0, AUX.LSB0 and the 15 Sub-Converters are routed to the perimeter of the array. For clarity, the appropriate switch means according to FIG. 1, 2, and 4 are not illustrated in FIG. 6.

FIG. 7 is a Table of Predicted Pre-Calibration differential linearity errors (DNL Errors) for the architecture and construction according to the preferred embodiment of the invention as described in connection with FIG. 1 through FIG. 6. In the second column, the permissible Max.+/-Errors for+/-½ LSB DNL Error, caused by the bits of the first column, are listed. The third column indicates the output contributions for each bit, and the fourth column shows the number of Unit-Current-Sources providing that contribution. For reasons of generality, this number for the M-Segments is stated as (64-A). The Predicted DNL Error for the Main-Converter is shown in the fifth column. Considered are the Major-Carry conditions of the 4 MSB's, the 4 LSB's, LSB1, LSB0 and AUX.LSB0. Also included are Total Predicted DNL Errors for the 4 MSB's and the 6 LSB's. Similarly, the Predicted DNL Error for the Sub-Converter is shown in the sixth column.

The distribution of Predicted Transfer function errors of the Main and Sub-Converters in response to Digital Input Data Signals, respectively Digital Control Data Signals, is shown in FIG. 8. For illustrative purposes, K=0.1 and A=2 have been used and the error has been normalized to LSB relative to 10 bits of resolution. Of course, those skilled in the art would be capable of extrapolating these, and the following distributions to other values for K, A and the number of bits of resolution.

FIG. 9 is a Flow Chart of the DNL Error Calibration Routine according to the preferred embodiment of the invention. The routine is described in detail, below.

FIG. 10 is an illustration of the Post-Calibration DNL Error distribution of the D/A Converter after execution of the Calibration Sequence according to the invention and with reference to the preferred embodiment. For reasons of clarity, this illustration also is based on K=0.1 and A=2 as for FIG. 8.

A block schematic of the complete illustrative D/A Converter including block schematics of circuit means capable of realizing the described Calibration Algorithm is shown in FIG. 11.

Digital Input Data Signals are shown, including 6 binary least significant bits, 6 LSBs, and 4 binary most significant bits, 4 MSBs. The 6 LSBs are connected to an LSB Encoder Logic block 1101, and the 4 MSBs are connected to an MSB Encoder Logic block 1103 and to Read Address inputs of a Calibration Sequencer Logic block 1105. Both Encoder Logic blocks have an input which is connected to an Enable signal. The outputs of the LSB and MSB Encoder Logic blocks are connected via the LSB BUS and the MSB BUS to respective inputs of the Main-Converter 1107. For clarity, only 3 of a total of 15 Sub-Converters 1501–1515 are shown and again for clarity only 3 of a total of 15 Registers 1601–1615 are depicted. The outputs of the Main-Converter 1107 and all 15 Sub-Converters are connected to appropriate inputs of a Resistive Means 1109, having a D/A Converter Output 1111. The input of a Storage Means and Measurement Means block 1113 is connected to the D/A Converter Output 1111. The digital signal inputs of all 15 Sub-Converters are individually connected to 15 individual Digital Control Data Signals. Those signals originate from the 15 Register 1601–1615 outputs. Each Register block Nr.1–Nr.15 has Read, Write and Data inputs. All 15 Register 1601–1615 data inputs are connected to a Data Bus originating from a Data Bus output of a Calibration Sequencer Logic block 1105. The Calibration Sequencer Logic block 1105 has 15 individual Write and Read outputs, which are connected individually to the appropriate inputs of the 15 Registers 1601–1615. The Calibration Sequencer Logic block 1105 has an output, AUX.LSB0, which is connected to a further input of the LSB Encoder Logic block 1101. Further outputs of the Calibration Sequencer Logic block 1105, M-Seg.Bus, are connected to further inputs of the MSB Encoder Logic block 1103. The output of the Storage Means and Measurement Means block 1113 is connected to a Write/Incr. input of the Calibration Sequencer Logic block 1105. Finally, an Enable signal is connected to a Calibration Enable input and a Clock signal is connected to a Calibration Clock input of the Calibration Sequencer Logic block 1105.

The details of all figures, FIG. 1 to FIG. 11 may be understood more comprehensively by considering the following descriptions of a preferred embodiment of the invention.

The architecture and construction details of the analog section of the D/A Converter and advantages arising from its practice will best be understood by first referring to the table of FIG. 7. The data contained in FIG. 7 are based on FIG. 1 through FIG. 6 and the above detailed description.

The D/A Converter according to one preferred embodiment of the invention, is of the current-mode type. Its analog output is derived from current-to-voltage conversion through a constant resistance. Thereby, the currents represent digital input data signals, which shall be referred to as an Input Code. For 10 bit resolution, the decimal equivalent of the Input Code ranges from 0 to 1023.

An ideal transfer function of Input Code versus output implies, that for Input Code increments of 1, the output increases by $1/1024$ relative to its maximum value at Input Code 1023. Deviations from this behavior are referred to as Differential Linearity Errors, or DNL Errors. The contribution to the Input Code of the MSB of the Digital Input Data Signal is 512. Therefore, a relative deviation of $+/-1/1024$ is permissible for the contribution of the MSB for a transfer function DNL Error of $+/-\frac{1}{2}$-LSB at an Input Code transition from 511 to 512. This transition is referred to as the MSB Major-Carry. Similarly, the relative deviations for other bits of the Digital Input Signal are derived and listed in the second column of FIG. 7.

As stated above, the analog equivalents of the Input Codes are currents. Therefore transfer function DNL Errors arise from relative deviations of individual current contributions.

A preferred embodiment of the invention segments the top 4 MSB's into 15 contributions, each of nominal value of 64 referred to the Input Code range. Thereby, the maximum relative current deviations for each M-Segment is $+/-1/128$ for $+/-\frac{1}{2}$ LSB DNL Error. The M-Segment Major-Carry Input Codes consequently are at 63 to 64, 127 to 128, 191 to 192 and so on, with the 15th M-Segment Major-Carry at 959 to 960.

The same segmentation method is utilized for the 4 most significant LSB's, where each segment contributes with a nominal value of 4. The maximum relative current deviations for each L-Segment is $+/-1/8$ for $+/-\frac{1}{2}$ LSB DNL Error. The L-Segment Major-Carry Input Codes consequently are at 3 to 4, 7 to 8, 11 to 12 and so on, with the 15th L-Segment Major-Carry at 59 to 60. The L-Segment Major-Carry Input Codes occur in the same manner for all multiples of 64, such as 64+3 to 64+4, 64+7 to 74+8 and so on. The effective contribution of the LSB1, LSB0 and AUX.LSB0 is $\frac{1}{2}$, $\frac{1}{4}$ and $\frac{1}{4}$ of one L-Segment, respectively. The Sub-Converters' 2 most significant bits, Sub-MSB2 and Sub-MSB1 are scaled equal to the Main-Converter's 2 least significant bits. The 4 least significant bits contribute as indicated in FIG. 7. The transfer function for any Sub-Converter is therefore a section of the Main-Converter transfer function, however with greater resolution of $1/16$ LSB.

The figures in the fourth column of the Table in FIG. 7 reflect the number of separate Unit-Current-Sources that provide the appropriate contributions. The embodiment described herein, may now be better understood by first returning to FIG. 1a.

As stated before, the control potentials applied to terminals I_CONTROL and VDS_CONTROL are generated separately and the circuitry involved, is not described herein. In general, a reference potential is generated by means of a closed-loop control circuit including a current source providing a current into a resistor. This action establishes the required potentials for the I_CONTROL and VDS_CONTROL terminals of the array of Unit-Current-Sources of the D/A Converter. It may be shown that a dominant factor in current variations for one common MOSFET current source is the Threshold Voltage Variation. The relative error of the current generated by the "current determining device" of FIG. 1a, may be expressed as follows;

$$dI/I = -dV_{th}/(V_{ef}/2),$$

where $V_{ef} = V_{gs} - V_{th}$, and $dV_{th}$ is the variation in Threshold Voltage. This variation is mainly due to process variations. Variations in drain-source voltage are substantially reduced by the "source follower device" of FIG. 1a by applying an appropriate bias potential to the VDS_CONTROL terminal. This measure also renders the Unit-Current-Source insensitive to variations of the potential existing at the I_OUT terminal.

According to the invention, multiple Unit-Current-Sources are employed, reducing the relative current error as follows:

$$\Delta(I)/I_u = (dI/I)/sqrt(N),$$

where $I_u$ is the average of the sum of individual currents and sqrt(N) is the square root of the number of Unit-Current-Sources contributing. When further applying a 4 sigma distribution range for the Threshold voltage variation and using the limits stated in the second column of Table of FIG. 7, it may be shown, that the 4σ distribution range of DNL Errors may be predicted by the following expression;

$$DNLx = \pm(M*K)/sqrt(N),$$

with, $$K = 4*(dI/I),$$

and where DNLx is the Predicted DNL Error range in LSB and M is the inverse of the limit for $\pm\frac{1}{2}$ LSB DNL Error performance. It may be understood, that the factor K depends on the operating conditions of the Unit-Current-Source, in particular on current magnitude, available bias voltage ranges, device aspect ratios and of course process parameters of the MOSFET devices. For typical conditions of low supply voltage and power consumption and choice of device dimensions, that do not result in excessive silicon area for the array of Unit-Current-Sources, practical values for K are around 0.1.

It will be apparent that DNLx may be reduced by increases of N. This however increases the silicon area, and it has been found in practice that Threshold voltage variations increase also. A further effect is that for given current consumption of a D/A Converter, the current contribution by each of a large number of individual current sources is reduced, and in turn causes an increase of K.

According to one aspect of the invention as shown in FIG. 1 to FIG. 6, the arrangement of the current sources responsive to the 6 least significant bits in conjunction with the arrangement of the Resistive Means results in an increase of the number of Unit-Current-Sources but without significant adverse effects.

Referring to FIG. 3 it may be evident that currents applied to the OUT_2 terminal have nominally half the effect on the potential developed at OUT_1, compared to the currents of the same magnitude if applied to OUT_1 terminal. The Resistive means therefore functions as a divider. The division factor for currents applied at network terminal OUT_2 is ½, at OUT_3 is ¼, at NWRK_1 is ⅛ and so on. It may be shown that deviations of resistance of the resistive elements of the Resistive Means used as a divider, in practice produce comparatively small effects on the DNL Errors of the Main-and Sub-Converters.

The combined effects of current variations of all 6 LSB's of the Main-Converter amount to a total DNLx of 3.606*K. The combined effect for the MSB's is the same as for any one M-Segment, i.e., 16*K. The combined effect for all bits of any Sub-Converter is a total of 2.309*K. These predicted DNL Error distributions over a "4 sigma" range are stated in the fifth and sixth columns of FIG. 7.

FIG. 8 is an illustration of these errors for a practical value of K=0.1. This implies a DNLx Error of 1.6 LSB for the 4 MSB Major-Carry, a DNLx Error of 0.36 LSB for the 6 LSB and a DNLx Error of 0.231 LSB for any Sub-Converter. According to the embodiment of the invention, a number of Unit-Current-Resources do not participate in the output current. This number is referenced as A and in the case as shown by the above figures, A=2 is used, reflecting the magnitude of the M-Segment DNLx Errors.

The reduction of the M-Segment currents by the predicted magnitude of DNL Errors, DNLx, facilitates a reliable Calibration routine and uncomplicated circuit means to perform significant reduction of the transfer function errors of the D/A Converter.

The DNL Error Calibration routine relates to the illustrated embodiment and its following description references known circuits which may be realized efficiently in silicon. A flow chart of the routine is shown in FIG. 9.

At the start 901, a Max-Count state, (C), is set to equal the number of Major-Carry transitions whose DNLx Error shall be calibrated, C=Max, and a Counter State, (j), is set to 0, j=0. This represents the Calibration Initialization. Subsequently, the Counter State is incremented by 1 (step 903), followed by setting all Sub-Converter outputs to 0, Sub #(1 to Max)=0, and also by setting all M-Segment outputs of the Main-Converter to 0, M-Seg#(1 to Max)=0, while setting the 6 LSB outputs of the Main-Converter to represent Input Code=63 and setting the AUX.LSB0 output to represent Input Code=1 (step 905). The D/A Converter output responds by exhibiting an output voltage of 64 VLSB, DAC-O/P=64*VLSB (step 907), where VLSB represents the voltage produced by an average LSB current flowing into the resistance connected between OUT_1 and COMMON_1. This voltage is a Temporary reference, REF (j), and is stored by appropriate storage means (also, step 907).

The sequence continues with resetting the 6LSB- and the AUX.LSB0- outputs to represent 0, while selecting one M-Segment output to represent Input Code=64, M-Seg#(j) Code=64 (step 909). The D/A Converter output will now respond with an output voltage, representing the selected M-Segment (step 911). This voltage contains the error components of the selected M-Segment in the form (−A+ DNLx)*VLSB.

At this point in the sequence flow, an Error Measurement Means is employed (step 913). It compares the DAC-O/P with the previous stored reference, REF(j). When the DAC-O/P is less than the Temporary Reference, REF(j), the selected Sub-Converter output current will be incremented (step 917), by means of a second counter state. A loop (steps 913 and 917), increases the DAC-O/P until it is larger than the Temporary Reference. Accordingly, when the DAC-O/P exceeds REF(j), the present states of the signals representing the second counter state are written (step 915) into a register, Reg#(j), selected also by the counter state, (j).

According to the illustrated embodiment of the invention, the transfer function of any Sub-Converter is a section of the Main-Converter transfer function with a range of (3+¹⁵⁄₁₆) LSB of the Main-Converter at a resolution of ¹⁄₁₆ of an LSB.

The accuracy and input sensitivity of both the storage and comparison means limit the ability to detect differences, suitable to take advantage of the resolution of the incremental DAC-O/P. When it is detected that the DAC-O/P is larger than REF(j), the write mentioned above is performed (step 915). This completes the error reduction sequence for the particular M-Segment. The above write is now followed by a logic comparison (step 919) of the Counter State with the Max. Count parameter. If the Counter State, (j), is less than (Max), the Calibration Sequence continues by incrementing the Counter State (step 903) as shown in FIG. 9.

When all M-Segments have been calibrated in the manner described above, the logic comparison (step 919) of the Counter State signals the end of the Calibration Sequence. Individual registers, (REG#1 to REG#MAX), now contain the respective Digital Control Data Signals applied to respective Sub-Converters, representing the individual DNL Error Correction for corresponding Major-Carry transitions.

FIG. 10 shows the distribution of remaining transfer function errors, after completion of the Calibration Sequence. For illustrative purposes the pre-calibration errors are taken to be those shown in FIG. 8. According to the invention, these remaining errors are substantially reduced from the DNL Errors of the uncalibrated D/A Converter. Post-calibration errors are more than a factor of 3 better than pre-calibration errors.

The operation of the calibrated D/A Converter for digital-to-analog conversion may be better understood by referring now to FIG. 11.

The logic operations employed in the Calibration as outlined in FIG. 9 and described above, are well understood general logic functions. The Calibration Sequencer Logic block 1105 shown in FIG. 11, represents one suitable implementation and it is understood that implementations, other than presented herein, may be derived from the description and understanding of the principle of the Calibration Method.

Numerical details used in the following description relate to the 10-bit converter described above. Referring to the form of implementation depicted in FIG. 11, the start of the Calibration Sequence is initiated by the Enable signal. This signal also serves to configure the LSB- and MSB Encoder logic 1101 and 1103. The LSB Encoder logic 1101 will be configured such that all signals of the LSB BUS respond to the state of the AUX.LSB0 signal in a way that the D/A Converter Output 1111 represents either Input Code (63+1) or 0. The MSB Encoder logic 1103 will be configured such, that the MSB BUS signals represent the M-Seg. Bus signals originating from the Calibration Sequencer Logic block 1105. These signals cause the D/A Converter Output 1111 to selectively represent one of the 15 M-Segment contributions, (64–A), at a time. The Clock signal into the Calibration Sequencer Logic block 1105 serves to step the AUX.LSB0-, M-Seg. Bus- and Data Bus signals through the sequence of the routine. The states of the Write/Incr. input cause either incrementing the Data Bus Code or selection of one of the Write(#) output signals in conjunction with the state of the M-Seg. Bus signals and storage of the Data Bus signal states in a Register 1001–1615 which is selected also in conjunction with the states of the M-Seg. Bus signals.

When the Calibration Sequence has been completed, the individual Registers, 1601–1615, contain representations of error correction components for the individual M-Segments.

The Enable signal is returned to a state disabling the calibration process and configuring the LSB- and MSB encoder logic 1101 and 1103 to accept Digital Input Data Signals.

For digital-to-analog conversion operation of the calibrated D/A Converter, the above correction components are applied to the D/A Converter Output by means of the Sub-Converters 1501–1515, responding to computed digital signals. The computation selectively combines digital input signals with the digital control data signals contained in the registers, 1601–1615. The 4 MSB's of the Digital Input Data Signals are used to select the Read input of individual Registers 1601–1615 in a manner corresponding to the selection of M-Segments by the MSB Encoder Logic block 1103. Selection implies that the selected Register 1601–1615 output data signals are read to the corresponding Sub-Converter 1501–1515, thereby adding an error-reduction term to the D/A Converter Output 1111. Any Register 1601–1615 that is not selected responds with output data signals representing an error-reduction term of zero.

In accordance with another aspect of the invention, DNL Errors of L-Segments of the Main-Converter are also subjected to error correction, thus improving the accuracy of resolution even further.

In accordance with a further aspect of the invention, the overall resolution of the D/A Converter may be extended by means of a separate Sub-Converter.

In accordance with yet a further aspect of the invention only one Sub-Converter is employed for error correction purposes. DNL Error correction data are derived from the execution of the Calibration Sequence except, that M-Segments are selected one at a time in the order of their selection as would be caused by increments of Major-Carry transitions by the Digital Input Data Signals. The Calibration Sequence is performed as described, except that the data signals being written to corresponding individual Registers represent the continuous sum of individual error correction contributions of the Sub-Converter. Registers are selected on the basis as described above. For digital-to-analog conversion operation of the calibrated D/A Converter, these sums of error correction components are applied to the D/A Converter output by means of the Sub-Converter.

In accordance with still a further aspect of the invention, the Main-Converter is constructed from binary-scaled contributions representing the Digital Input Data Signals. These contributions provide predictable transfer function errors which are determined by means of a Calibration Sequence utilizing the principles of the Algorithm as referenced by the above descriptions of the preferred embodiment. Error correction components are applied to the output, having the effect of reducing the transfer function errors to magnitudes less than implied by the resolution of the Main-Converter.

Those, understanding the invention as described above, may conceive other aspects of the invention which utilize the principles of the invention. Although the above description is of one embodiment of the invention, the scope of the invention is not to be construed as limited thereby. The scope of the invention is only to be limited by the scope of the appended claims.

What is claimed is:

1. A digital-to-analog converter with programmable transfer function errors for providing accuracy and resolution improvements, comprising:

first current-steering converter means responsive to first digital data signals and having predetermined transfer function errors, second current-steering converter means responsive to second digital data signals and having transfer function errors less than implied by the combined resolution of said first and said second digital data signals, a plurality of current-steering converter means responsive to a plurality of separate digital data signals and having transfer function errors of less than those of said second current-steering converter means, memorizing means for said plurality of separate digital data signals, resistive means, having a predetermined number of terminals connected to the outputs of said first, said second and said plurality of current-steering converter means and providing a digital-to-analog voltage output between two of said number of terminals, calibration means determining said plurality of separate digital data signals in a manner to program the transfer function of said first current-steering converter means for the purpose of reducing transfer function errors of said digital-to-analog converter voltage output to less than implied by the combined resolution of said first and said second digital data signals, digital data signal control means operatively controlling said first and said second current-steering converter means in response to said first and second digital data signals and further operatively controlling said plurality of current-steering converter means by selectively accessing said memorizing means for said plurality of separate digital data signals.

2. A digital-to-analog converter with programmable transfer function errors for providing accuracy and resolution improvements, comprising:

first current-steering converter means responsive to first digital data signals and having predetermined transfer function errors, second current-steering converter means responsive to second digital data signals and having transfer function errors less than implied by the combined resolution of said first and said second digital data signals, third current-steering converter means responsive to third digital data signals and having transfer function errors of less than those of said second current-steering converter means, memorizing means for said third digital data signals, resistive means, having a predetermined number of terminals connected to the outputs of said first, said second and said third current-steering converter means and providing a digital-to-analog voltage output between two of said number of terminals, calibration means determining said third digital data signals in a manner to program the transfer function of said first current-steering converter means for the purpose of reducing transfer function errors of said digital-to-analog converter voltage output to less than implied by the combined resolution of said first and second digital data signals, digital data signal control means operatively controlling said first and said second current-steering converter means in response to said first and said second digital data signals and further operatively controlling said third current-steering converter means by selectively accessing said memorizing means for said third digital data signals.

3. A digital-to-analog converter with programmable transfer function errors according to claim 1, wherein the calibration means comprises:

a voltage storage means, a comparison means having an input and a digital output and consisting of amplification means and switch means, digital means to provide said plurality of digital data signals in response to the state of said digital output of said comparison means, digital control means to selectively transfer said plurality of digital data signals to said memorizing means.

4. A digital-to-analog converter with programmable transfer function errors according to claim 2, wherein the calibration means comprises:

a voltage storage means, a comparison means having an input and a digital output and consisting of amplification means and switch means, digital means to provide said third digital data signals in response to the state of said digital output of said comparison means, digital control means to selectively transfer said third digital data signals to said memorizing means.

5. A digital-to-analog converter with programmable transfer function errors according to claims 1, 2, 3 or 4, comprising:

fourth converter means responsive to fourth digital data signals representing an increase of the combined resolution of said first and second digital data signals for the purpose of providing a digital-to-analog converter voltage output with increased resolution, digital data signal control means, operatively controlling said fourth current-steering converter means in response to said fourth digital data signals.

6. A digital-to-analog converter with programmable transfer function errors according to claims 1,2, 3 or 4, wherein the resistive means consists of a resistive element exhibiting a resistance of R, connected between a digital-to-analog converter output terminal and the non-terminated terminal of a R-2R ladder network composed of resistive elements exhibiting a resistance of R and having a predetermined number of terminals.

7. A digital-to-analog converter with programmable transfer function errors according to claims 1, 2, 3 or 4, wherein the resistive means consists of a resistive element exhibiting a resistance of a predetermined value, connected between a digital-to-analog converter output terminal and the non-terminated terminal of a R-2R ladder network composed of resistive elements exhibiting a resistance of R and having a predetermined number of terminals.

8. A digital-to-analog converter with programmable transfer function errors according to one of claims 1, 2, 3 or 4, wherein the resistive means consists of a resistive element exhibiting a resistance of a predetermined value, connected between a digital-to-analog converter output terminal and a network of resistive elements connected in series, each said resistive element exhibiting predetermined resistance, and said network having a predetermined number of terminals.

9. A method by which the transfer function errors of a Digital-to-Analog Converter according to claims 1, 2, 3 or 4, are reduced, the method comprising the steps of:

receiving a first digital data signal and converting it to a first output;

memorizing said first output;

receiving a second digital data signal and converting it to a second output;

measuring a deviation between said memorized first output and said second output;

adjusting said second digital data signal in response to said measured deviation and converting it to an adjusted second output at which said measured deviation is substantially at a minimum;

memorizing said adjusted second digital data signal; and selectively accessing said memorized adjusted second digital data signal in response to a Digital-to-Analog Converter digital input signal.

10. A Digital-to-Analog Converter with programmable transfer function errors having a digital data input signal, the Converter comprising:

a Main-Converter receiving a digital data input signal and producing an output current responding to said digital data input signal, the Main-Converter output current having a first range at a first resolution with predetermined transfer function errors;

a predetermined number of Sub-Converters each responding to one of a predetermined number of computed digital signals and each Sub-Converter producing output currents in response to said computed digital signals, the output current of each Sub-Converter having a range smaller than said first range at a resolution finer than said first resolution with transfer function errors smaller than implied by said first resolution;

a resistor network having input terminals connected to receive the Main-Converter output current and any Sub-Converter output currrent and having two output terminals; and a Calibration circuit connected to the output terminals of the Resistor Network and connected to the digital data input signal and providing the computed digital signals for each Sub-Converter.

11. The converter of claim 10, wherein the calibration circuit further comprises:

means for measuring an error at the output terminals of the resistor network;

means for converting said measured errors to digital calibration data signals;

means for memorizing said digital calibration data signals;

means responsive to the digital data input signals for accessing said digital calibration signals to produce the computed digital signals for each of the predetermined number of Sub-Converters.

12. A method by which the transfer function errors of a Digital-to-Analog Converter according to claim 10 or 11 are reduced, the method comprising the steps of:

receiving a first digital data input signal and converting a Main-Converter first output current producing a first output voltage;

memorizing said first output voltage;

receiving a second digital data input signal and converting a Main-Converter second output current;

receiving one of a predetermined number of computed digital signals for one of a predetermined number of Sub-Converters and converting a Sub-Converter first output current;

combining the Main-Converter second output current with the Sub-Converter first output current and converting the combined output currents to a second output voltage;

measuring a deviation between said memorized first output voltage and said second output voltage;

adjusting said computed digital signal in response to said measured deviation and converting it to a Sub-Converter adjusted first output current at which said measured deviation between said memorized first output voltage and the adjusted second output voltage obtained from conversion of said Main-Converter second output current combined with a Sub-Converter adjusted first output current is substantially at a minimum;

memorizing said adjusted computed digital signal; and selectively accessing said memorized adjusted computed signal in response to the digital input data signal.

* * * * *